US009583517B2

(12) United States Patent
Hu

(10) Patent No.: US 9,583,517 B2
(45) Date of Patent: Feb. 28, 2017

(54) POLYCRYSTALLINE OXIDE THIN-FILM TRANSISTOR ARRAY SUBSTRATE AND METHOD OF MANUFACTURING SAME

(71) Applicant: BOE TECHNOLOGY GROUP CO., LTD., Beijing (CN)

(72) Inventor: Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/785,719

(22) PCT Filed: Apr. 10, 2015

(86) PCT No.: PCT/CN2015/076263
§ 371 (c)(1),
(2) Date: Oct. 20, 2015

(87) PCT Pub. No.: WO2016/074427
PCT Pub. Date: May 19, 2016

(65) Prior Publication Data
US 2016/0343732 A1    Nov. 24, 2016

(30) Foreign Application Priority Data
Nov. 13, 2014    (CN) .......................... 2014 1 0640940

(51) Int. Cl.
*H01L 27/12*    (2006.01)
*H01L 21/02*    (2006.01)
(Continued)

(52) U.S. Cl.
CPC ....... *H01L 27/127* (2013.01); *H01L 21/02274* (2013.01); *H01L 21/02472* (2013.01);
(Continued)

(58) Field of Classification Search
CPC .................... H01L 21/02172; H01L 21/02436; H01L 27/1274
See application file for complete search history.

(56) References Cited

U.S. PATENT DOCUMENTS

2008/0308796 A1*  12/2008  Akimoto ............. H01L 27/1225
                                                                257/43
2010/0140609 A1    6/2010  Yano et al.
(Continued)

FOREIGN PATENT DOCUMENTS

| CN | 103700665 A | 4/2014 |
| CN | 104319262 A | 1/2015 |
| TW | 201431077 A | 8/2014 |

OTHER PUBLICATIONS

ISR issued in international application No. PCT/CN2015/076263 dated Aug. 21, 2015.
(Continued)

*Primary Examiner* — Cheung Lee
(74) *Attorney, Agent, or Firm* — Nath, Goldberg & Meyer; Joshua B. Goldberg; Christopher Thomas

(57) ABSTRACT

This invention provides a polycrystalline oxide thin-film transistor (TFT) array substrate and a method of manufacturing the same. As the polycrystalline oxide thin film layer of the polycrystalline oxide TFT array substrate is formed by a two-step process according to the present invention, the ultra-high temperature annealing process required in the prior art is obviated, and the object of producing a polycrystalline oxide TFT array substrate by the existing manufacturing facilities of the amorphous oxide TFT array substrates is achieved without adding any special equipment or special operation, and it is easy to implement; meanwhile, the energy consumption is reduced as the high temperature annealing is no longer needed.

12 Claims, 4 Drawing Sheets

(51) Int. Cl.
*H01L 21/77* (2006.01)
*H01L 29/786* (2006.01)
*H01L 29/10* (2006.01)
*H01L 21/465* (2006.01)
*H01L 21/469* (2006.01)
*H01L 21/477* (2006.01)
*H01L 29/66* (2006.01)

(52) U.S. Cl.
CPC .. *H01L 21/02483* (2013.01); *H01L 21/02565* (2013.01); *H01L 21/02592* (2013.01); *H01L 21/02631* (2013.01); *H01L 21/465* (2013.01); *H01L 21/469* (2013.01); *H01L 21/477* (2013.01); *H01L 21/77* (2013.01); *H01L 27/12* (2013.01); *H01L 27/1225* (2013.01); *H01L 27/1274* (2013.01); *H01L 27/1296* (2013.01); *H01L 29/10* (2013.01); *H01L 29/66969* (2013.01); *H01L 29/786* (2013.01); *H01L 29/7869* (2013.01)

(56) References Cited

U.S. PATENT DOCUMENTS

2011/0031490 A1 2/2011 Wang et al.
2012/0205648 A1 8/2012 Yokozeki

OTHER PUBLICATIONS

First Office Action dated Aug. 11, 2016 corresponding to Chinese application No. 201410640940.7.

\* cited by examiner

POLYCRYSTALLINE OXIDE THIN-FILM TRANSISTOR ARRAY SUBSTRATE AND METHOD OF MANUFACTURING SAME

This is a National Phase Application filed under 35 U.S.C. 371 as a national stage of PCT/CN2015/076263, filed Apr. 10, 2015, an application claiming the benefit of Chinese Application No. 201410640940.7, filed Nov. 13, 2014, the content of each of which is hereby incorporated by reference in its entirety.

FIELD OF THE INVENTION

The present invention relates to the technical field of manufacturing of display products, and particularly, to a polycrystalline oxide thin-film transistor (TFT) array substrate and a method of manufacturing the same.

BACKGROUND OF THE INVENTION

Polycrystalline oxide channels have the properties of high mobility, resistance to acid etching, excellent stability and the like, and the manufacturing techniques thereof are highly concerned in the display panel industry.

Crystal growth takes place in two manners, i.e., homogeneous growth, and heterogeneous growth. The homogeneous growth requires a high degree of undercooling, and it is relatively difficult to grow a crystal in this manner. The heterogeneous growth takes place with the aid of foreign particles or existing nuclei. As less energy is required, the heterogeneous growth takes place quickly. Moreover, according to the theory of crystal growth, atoms are less prone to pack on a smooth interface, in which case crystal growth takes place slowly. In contrast, atoms are liable to pack on a coarse interface, in which case crystal growth takes place quickly.

$In_2O_3$, ZnO, $Ga_2O_3$, $SnO_2$ and composites thereof which are used in the current oxide channels have an extremely high melting point (above 1000° C.) and crystallization point respectively, the processes of film forming of polycrystalline oxide channels generally take place at a faster film forming rate, and the substrates for film forming are mostly in amorphous state. Therefore, the oxide thin films formed by conventional processes, e.g., magnetron sputtering deposition, pulsed laser deposition, and solution process for preparation of amorphous film, are generally in amorphous state. High energy is required to convert such amorphous thin films into polycrystalline state, for example, by ultra-high temperature annealing (greater than 450° C., usually about 600° C.), which will consume much energy.

In the existing production line of TFT array substrates, the annealing equipment typically has an upper temperature limit of 450° C. When the temperature exceeds 450° C., the annealing equipment will face great challenges in the heater and the homogeneity of heating. Consequently, it is relatively difficult to perform the ultra-high temperature heat treatment on the production line after film forming. Moreover, the high temperature annealing treatment has drawbacks including high requirement on the performance of the glass substrate, high energy consumption and the like.

Therefore, development of a process for manufacturing a TFT array substrate having polycrystalline oxide channels on the existing production line has become the focus of research.

SUMMARY OF THE INVENTION

In order to solve the problem that the existing production line of TFT array substrates is not suitable for manufacturing a TFT array substrate having polycrystalline oxide channels, the present invention provides a method of manufacturing a TFT array substrate having polycrystalline oxide channels.

The present invention provides a method of manufacturing a polycrystalline oxide TFT array substrate, comprising the following steps:

1) forming an amorphous oxide thin film layer on a substrate;
2) selectively etching the amorphous oxide thin film layer;
3) passivating and annealing the amorphous oxide thin film layer after the step 2;
4) forming a second oxide thin film on the oxide thin film layer after the step 3; and
5) annealing the second oxide thin film formed in the step 4;

wherein the step 4 further comprises forming active layer channels by a patterning process after the formation of the second oxide film; or the step 5 further comprises forming active layer channels by a patterning process after annealing the second oxide thin film.

Preferably, the amorphous oxide thin film layer formed in the step 1 has a thickness in the range of 50-150 Å, such as 50 Å, 75 Å, 100 Å, 125 Å, or 150 Å.

The oxide may be selected from those generally used in the art for forming a transparent semiconductor thin film, such as zinc oxide (ZnO), indium oxide (InO, e.g. $In_2O_3$), aluminum indium oxide (AlO), indium gallium zinc oxide (IGZO), yttrium doped zinc oxide (YZO), indium tin zinc oxide (ITZO), gallium oxide (e.g. $Ga_2O_3$), tin oxide (e.g. $SnO_2$), etc.

Preferably, in the step 1 the amorphous oxide thin film layer is formed by magnetron sputtering; the magnetron sputtering is performed under the following conditions: power of 2-8 Kw, pressure of 0.3-0.8 Pa, oxygen content of 5%-50%, and room temperature.

Preferably, in the step 2 the irregularly packed atoms in the amorphous oxide thin film layer are etched off, while the regularly packed atoms are left.

Preferably, the selective etching in the step 2 is a dry etching process; the amorphous oxide thin film layer is bombarded with a plasma of $N_2$ or Ar gas; the dry etching process is performed under the following conditions: power of 1200-1800 W, pressure of 1500-2500 mTorr, temperature of 120-180° C., and processing time of 150-200 s.

Preferably, the selective etching in the step 2 is a wet etching process; the etching process is performed by using an acidic etching solution capable of corroding the amorphous oxide thin film layer, such that 10-50% (e.g. 10%, 20%, 30%, 40%, or 50%) of the amorphous oxide thin film layer is maintained in the etching region.

Preferably, the annealing in the step 3 is performed at a temperature of 300-450° C. (e.g. 300° C., 325° C., 350° C., 375° C., 400° C., 425° C., or 450° C.) for 1-2 h.

Preferably, the passivating in the step 3 is a process of plasma passivation.

Preferably, in the process of plasma passivation, the amorphous oxide thin film layer is passivated with $N_2O$ plasma; the passivation process is performed under the following conditions: power of 800-1200 W, pressure of 1200-1800 mTorr, temperature of 150-250° C., and processing time of 50-100 s.

Preferably, in the step 4 a magnetron sputtering process is adopted to form a second oxide thin film on the oxide thin film layer after the step 3; the magnetron sputtering process is performed under the following conditions: power of 3-10 Kw, pressure of 0.8-1.2 Pa, oxygen content of 5-50%, film forming rate of less than 20 Å/scan, and room temperature.

Preferably, the second oxide thin film formed in the step 4 has a thickness in the range of 300-1000 Å, such as 300 Å, 400 Å, 500 Å, 600 Å, 700 Å, 800 Å, 900 Å, or 1000 Å.

Preferably, the annealing in the step 5 is performed at a temperature of 300-450° C. (e.g. 300° C., 325° C., 350° C., 375° C., 400° C., 425° C., or 450° C.) for 1-2 h.

Another object of the present invention is to provide a polycrystalline oxide TFT array substrate, which is produced by the aforesaid method of manufacturing a polycrystalline oxide TFT array substrate.

The advantageous effects of the present invention include: as the polycrystalline oxide thin film layer of the polycrystalline oxide TFT array substrate is formed by a two-step process according to the present invention, the ultra-high temperature annealing process required in the prior art is obviated, and the object of producing a polycrystalline oxide TFT array substrate by the existing manufacturing facilities of the amorphous oxide TFT array substrates is achieved without adding any special equipment or special operation, and it is easy to implement; meanwhile, the energy consumption is reduced as the high temperature annealing is no longer needed.

DETAILED DESCRIPTION OF CERTAIN EMBODIMENTS

The present invention will be described in more detail with reference to certain embodiments and the accompanying figures, so that a person skilled in the art can get a better understanding of the technical solutions provided by the invention.

Herein, the recitation of numerical ranges by endpoints includes all subsets and numbers subsumed within that range (e.g., 300-450° C. includes 300° C., 350° C., 400° C., 450° C., 300-400° C., 300-380° C., etc.).

Example 1

As shown in FIGS. 1-9, this example provides a method of manufacturing a polycrystalline oxide TFT array substrate, comprising the following steps:

1) forming an amorphous oxide thin film layer on a substrate;

2) selectively etching the amorphous oxide thin film layer;

3) passivating and annealing the amorphous oxide thin film layer after the step 2;

4) forming a second oxide thin film on the oxide thin film layer after the step 3; and 5) annealing the second oxide thin film formed in the step 4, thereby forming a polycrystalline oxide thin film.

In this example, the polycrystalline oxide thin film layer of the polycrystalline oxide TFT array substrate is formed by a two-step process, such that the ultra-high temperature annealing process required in the prior art is obviated, and the object of producing the polycrystalline oxide TFT array substrate by the existing manufacturing facilities of the amorphous oxide TFT array substrates is achieved without adding any special equipment or special operation, and it is easy to implement; meanwhile, the energy consumption is reduced as the high temperature annealing is no longer needed.

In the step of selective etching, the irregularly packed atoms in the amorphous structure are preferentially etched off. On the other hand, the regularly packed atoms tend to remain in the growth plane during the incompletely etching process as they have a higher binding energy, and after etching they are in a metastable state as a plurality of dangling bonds are formed on the surface thereof due to the redox effect. Those closely and regularly packed atom clusters divide the growth plane into numerous regular packing frames, such that the atoms having a matchable structure and size can arrange regularly therebetween and grow into crystal grains. In crystallography, the growth centers of these crystals are known as crystal nuclei.

Particularly, a polycrystalline oxide thin film layer on a TFT array substrate is formed by the following five steps:

Step 1): Forming an Amorphous Oxide Thin Film Layer on a Substrate

Figure 1:
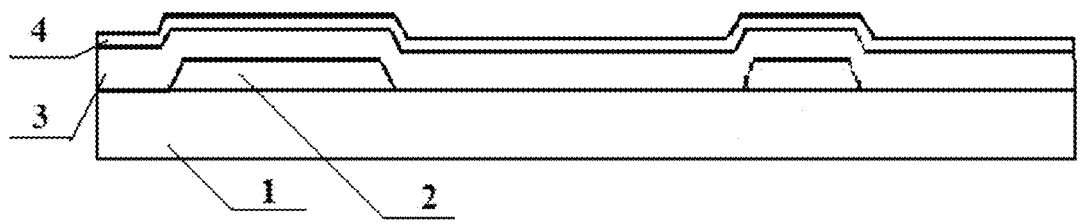
FIG. 1 is a schematic view of the structure after formation of a first oxide thin film layer in Example 1 of the present invention.

As shown in FIG. 1, a gate electrode 2 is formed on a substrate 1 by a patterning process and a gate insulating layer 3 is formed on the gate electrode 2.

Then, an amorphous oxide thin film layer 4 is formed from an IGZO target (produced by Mitsui) by a magnetron sputtering process. The magnetron sputtering process is performed under the following conditions: power of 5 Kw, pressure of 0.5 Pa, oxygen content of 30%, and room temperature. It is to be understood that the process conditions of magnetron sputtering can be selected from the following ranges: power of 2-8 Kw, pressure of 0.3-0.8 Pa, and oxygen content of 5% to 50%.

The amorphous oxide thin film layer formed by the magnetron sputtering process has a thickness of 100 Å. It is to be understood that the thickness of the amorphous oxide thin film layer formed by magnetron sputtering may range from 50 to 150 Å.

Figure 3A:
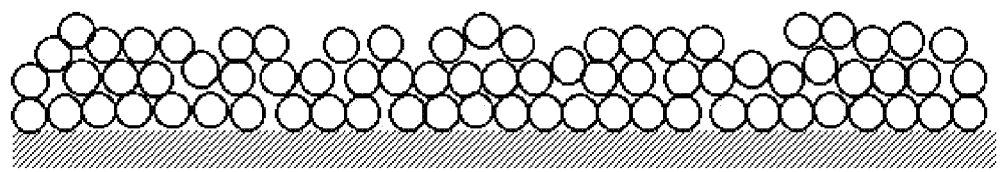
FIG. 3 includes an enlarged schematic view (FIG. 3a) of the structure of the amorphous oxide thin film layer shown in FIG. 1, and a scanning electron microscope (SEM) photograph showing a section of the thin film layer (FIG. 3b)
Figure 3B:
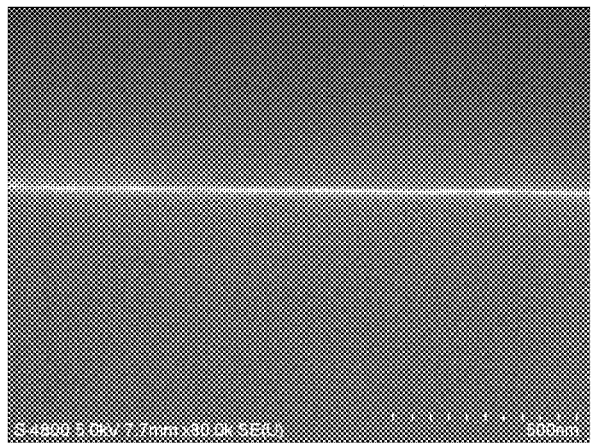

FIGS. 3*a* and 3*b* are an enlarged schematic view of the structure of the amorphous oxide thin film layer and a SEM sectional photograph thereof, respectively.

Step 2): Selectively Etching the Amorphous Oxide Thin Film Layer

The oxide thin film layer formed in Step 1 is amorphous, and an enlarged schematic view thereof is shown in FIG. 3*a*. There are irregularly packed atom clusters and regularly packed atom clusters arranging alternately in the amorphous structure.

The irregularly packed atom clusters have a lower binding energy, while the regularly packed atom clusters have a higher binding energy. As such, by a process of selective etching, the irregularly packed atom clusters can be etched off, while the regularly packed atom clusters are left. Thus, the regularly packed atom clusters remain in the growth plane due to the higher binding energy, and after etching they are in a metastable state as a plurality of dangling bonds are formed on the surface thereof due to the redox effect, which are more beneficial to formation of a second film.

Those closely and regularly packed atom clusters divide the growth plane into numerous regular packing frames. In a second sputtering process, the atoms having a matchable structure and size can arrange regularly therebetween and grow into crystal grains.

The selective etching may be carried out by a dry etching process or a wet etching process. By controlling the conditions of the respective processes, the irregularly packed atom clusters are etched off, while the regularly packed atom clusters are left.

Figure 2:
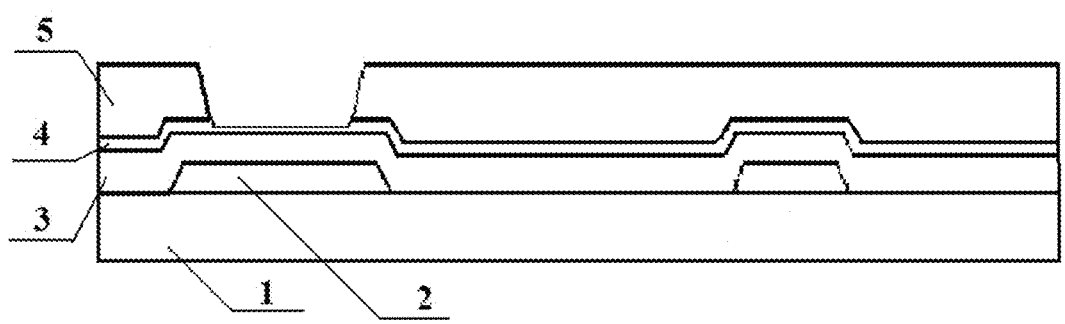
FIG. 2 is a schematic view of the structure after selectively etching the first oxide thin film layer in Example 1 of the present invention.
Figure 4:
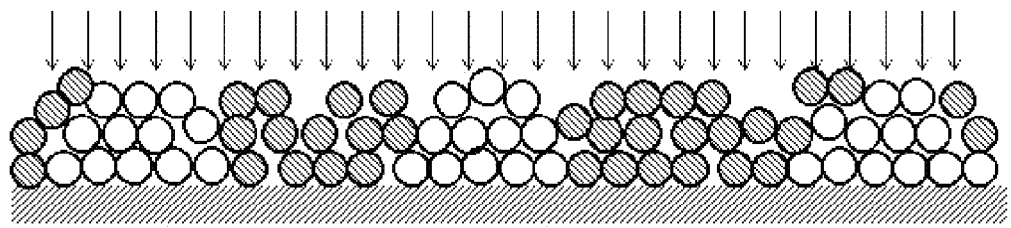
FIG. 4 is a schematic view of the microstructure of the first oxide thin film layer being selectively etched in Example 1 of the present invention.

More particularly, as shown in FIGS. 2 and 4, a photoresist 5 is coated on the oxide thin film layer, followed by exposing and developing to selectively etching the oxide thin film layer above the gate electrode 4. In FIG. 4, the black circles represent the irregularly packed atoms to be etched off, and the white circles represent the regularly packed atoms to be left.

Figure 5:
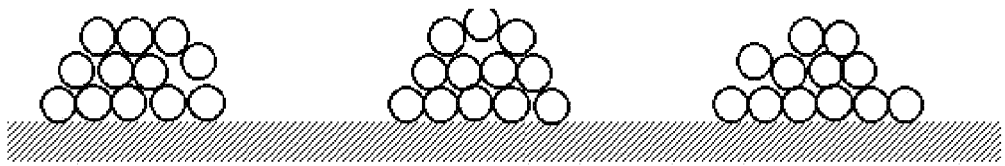
FIG. 5 is a schematic view of the microstructure after selectively etching the first oxide thin film layer in Example 1 of the present invention.

As shown in FIG. 5, after the selective etching, numerous regular packing frames (crystal nuclei) are formed on the oxide thin film layer, which are beneficial to formation of a second film.

This example is illustrated by an exemplary dry etching process, for example, involving bombarding the amorphous oxide thin film layer by a plasma of $N_2$ (or Ar) gas. The dry etching process is performed under the following conditions: power of 1500 W, pressure of 2000 mTorr, temperature of 150° C., and processing time of 180 s. It is to be understood that the process parameters of the dry etching can be selected from the following ranges: power of 1200-1800 W, pressure of 1500-2500 mTorr, temperature of 120-180° C., and processing time of 150 s-200 s.

It is to be understood that a wet etching process may be adopted as well. For example, a 100-fold dilution of an acid-based etching liquid may be used to etch the amorphous oxide thin film layer for a time period (about 10 s) which is 50%-90% of the completely etching time (i.e., the time taken for etching off the amorphous oxide thin film layer completely), such that 10-50% of the thickness of the thin film layer is maintained. The content of the strong acid (e.g. nitric acid or sulfuric acid) in the etching liquid is less than 1%, and the etching rate is controlled to be less than 10 Å/s.

Step 3): Passivating and Annealing the Amorphous Oxide. Thin Film Layer after the Step 2

Figure 6A:
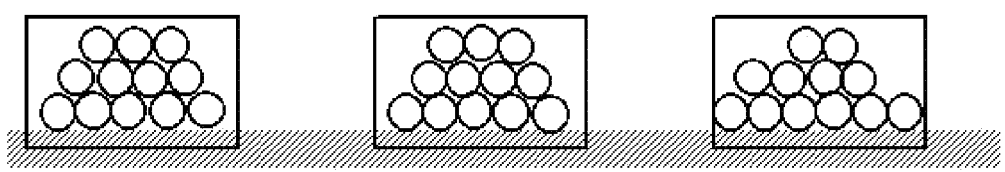
FIG. 6 includes a schematic view of the microstructure after passivating and annealing the selectively-etched oxide thin film layer in Example 1 of the present invention (FIG. 6a), and a SEM photograph showing a section and a surface thereof (FIG. 6b, wherein the inset in the upper right corner shows the surface of the film)

As shown in FIG. 6*a*, the regularly packed atom clusters that remain after the selective etching process are passivated and annealed, so as to increase the dangling bonds of the atoms in the surface of the atom clusters and eliminate a few defects (partially irregular arrangement) in the surface of the atom clusters. This results in the atom clusters that are completely packed regularly (crystal nuclei), and the atom clusters form numerous regular packing frames on the growth plane, which become the center of crystal growth during formation of a second film.

The passivation may be carried out by a plasma passivation process. For example, the amorphous oxide thin film layer is passivated by $N_2O$ plasma. The passivation is performed under the following conditions: power of 1000 W, pressure of 1500 mTorr, temperature of 200° C., and processing time of 80 s.

It is to be understood that the process parameters of the passivation can be selected from the following ranges: power of 800-1200 W, pressure of 1200-1800 mTorr, temperature of 150-250° C., and processing time of 50-100 s.

After the passivation process, an annealing treatment is carried out at a temperature of 350° C. for 1 h. It is to be understood that the process parameters of the annealing treatment can be selected from the following ranges: temperature of 300-450° C., and annealing time of 1-2 h.

Figure 6B:
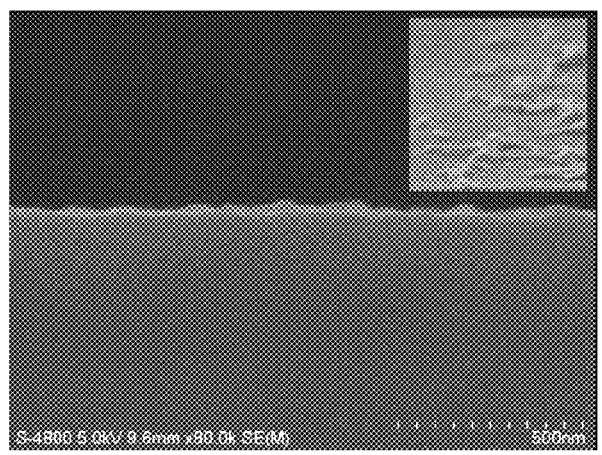

By the passivation and annealing treatment, the dangling bonds of the atoms in the surface of the atom clusters are increased and a few defects in the surface of the atom clusters are eliminated, which are beneficial to formation of a second film. FIG. 6*b* is a SEM photograph showing a section and a surface of the selectively-etched oxide thin film layer which has been subjected to the passivation and annealing treatment, wherein the inset in the upper right corner of the figure shows the surface of the film.

Step 4): Forming a Second Film on the Amorphous Oxide Thin Film Layer after the Step 3

Figure 7:
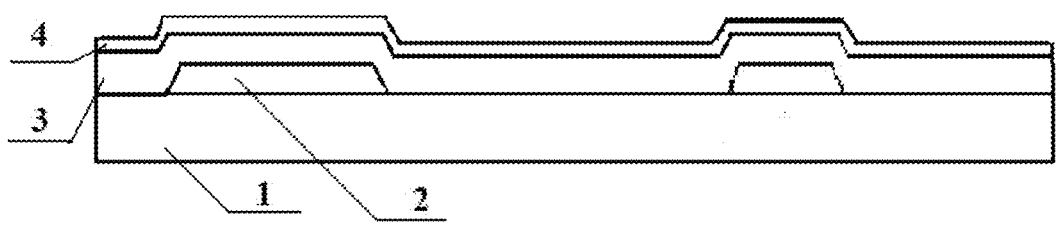
FIG. 7 is a schematic view of the structure after formation of a second film on the first oxide thin film layer which has been subjected to the selective etching, passivation and annealing treatment in Example 1 of the present invention.

As shown in FIG. 7, the second film may be formed by a magnetron sputtering process under the following conditions: power of 8 Kw, pressure of 1.0 Pa, oxygen content of 40%, film forming rate of 15 Å/scan (i.e., the deposited thickness of the film layer is 15 Å per scan), and room temperature.

It is to be understood that the conditions of magnetron sputtering can be selected from the following ranges: power of 3-10 Kw, pressure of 0.8-1.2 Pa, oxygen content of 5-50%, film forming rate of less than 20 Å/scan, and room temperature.

The conditions of the aforesaid second film forming process are controlled to form an amorphous oxide thin film layer having a thickness of 800 Å. It is to be understood that the thickness of the amorphous oxide thin film layer may range from 300 to 1000 Å.

Step 5): Annealing the Amorphous Oxide Thin Film Layer after the Step 4

The annealing treatment of Step 5 is carried out at a temperature of 350° C. for 2 h. By annealing, the amorphous oxide thin film layer becomes a polycrystalline oxide thin film layer.

It is to be understood that the process parameters of the annealing treatment can be selected from the following ranges: temperature of 300-450° C., and annealing time of 1-2 h.

In the aforesaid two-step process of forming a polycrystalline oxide thin film layer, the temperatures of the two annealing treatments are both controlled below 450° C. Thus, the existing manufacturing facilities of TFT array substrates can be applied, without adding any special equipment or special operation.

Figure 8:
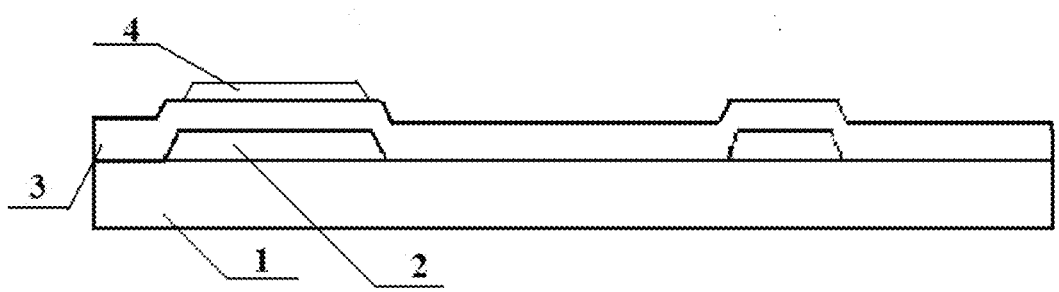
FIG. 8 is a schematic view of the structure after formation of a polycrystalline oxide active layer in Example 1 of the present invention.

Optionally, as shown in FIG. 8, an active layer of the polycrystalline oxide is formed by a patterning process. The patterning process may be conducted in Step 4 but after formation of the second film, or in Step 5 but after the annealing treatment.

Figure 9A:
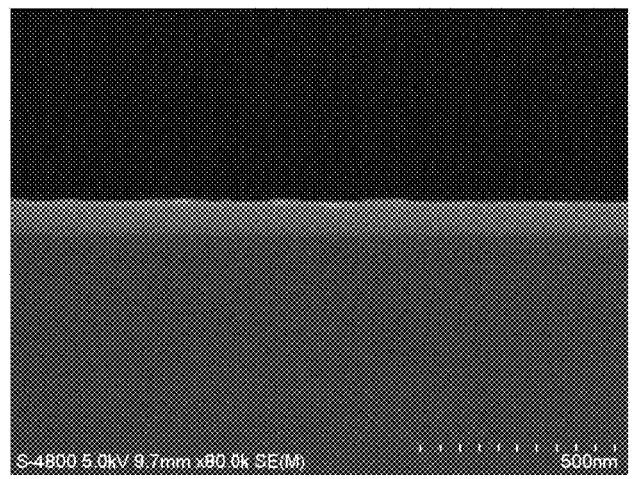
FIG. 9 includes a SEM sectional photograph (FIG. 9a) and a XRD spectrum (FIG. 9b) of the polycrystalline oxide thin film produced by steps 1-5 in Example 1 of the present invention.
Figure 9B:
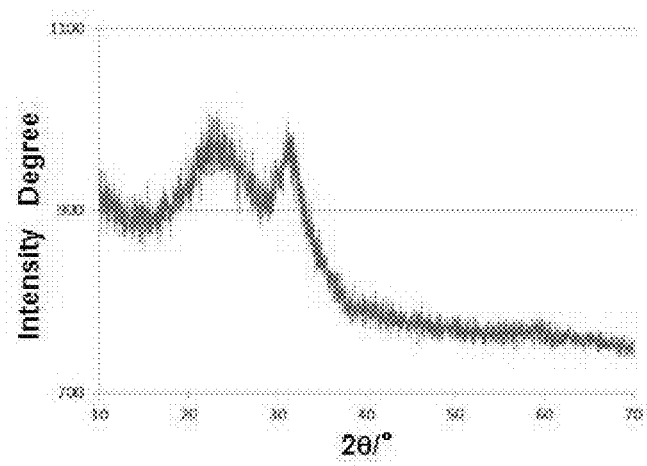

FIGS. 9a and 9b respectively show a SEM sectional photograph and a XRD spectrum of the polycrystalline oxide thin film produced by Example 1. The apparatus and conditions of the XRD test are as follows:

Apparatus: D8 Advance, Bruker;
X-ray source: Cu Kα-ray;
Scanning range: 10-70°;
Step: 0.02°.

It can be seen that, by the process of the aforesaid steps 1-5, a C-axis oriented (002) crystalline IGZO thin film is obtained, and the oriented crystallization peak is at 31.2°.

Example 2

This example provides a polycrystalline oxide TFT array substrate, which is produced by the aforesaid method of manufacturing a polycrystalline oxide TFT array substrate.

The polycrystalline oxide TFT array substrate provided by this example can be produced by conventional manufacturing facilities of TFT array substrates, without adding any special equipment or special operation.

It should be understood that the above embodiments of the invention have been disclosed only for illustrating the principle of the present invention, but they are not intended to limit the present invention. The person skilled in the art can make various modifications and variations of the invention without departing from the spirit and scope of the invention, thus the modifications and variations of the invention are included within the scope of the present invention.

The invention claimed is:

1. A method of manufacturing a polycrystalline oxide thin-film transistor array substrate, characterized in that the method comprises the following steps:
   1) forming an amorphous oxide thin film layer on a substrate;
   2) selectively etching the amorphous oxide thin film layer;
   3) passivating and annealing the amorphous oxide thin film layer after the step 2;
   4) forming a second oxide thin film on the oxide thin film layer after the step 3; and
   5) annealing the second oxide thin film formed in the step 4;
   wherein the step 4 further comprises forming active layer channels by a patterning process after the formation of the second oxide film; or the step 5 further comprises forming active layer channels by a patterning process after annealing the second oxide thin film.

2. The method of manufacturing a polycrystalline oxide thin-film transistor array substrate according to claim 1, characterized in that the amorphous oxide thin film layer in the step 1 has a thickness in the range of 50-150 Å.

3. The method of manufacturing a polycrystalline oxide thin-film transistor array substrate according to claim 1, characterized in that in the step 1 the amorphous oxide thin film layer is formed by a magnetron sputtering process; wherein the magnetron sputtering process is performed under the following conditions: power of 2-8 Kw, pressure of 0.3-0.8 Pa, oxygen content of 5%-50%, and room temperature.

4. The method of manufacturing a polycrystalline oxide thin-film transistor array substrate according to claim 1, characterized in that in the step 2, irregularly packed atoms in the amorphous oxide thin film layer are etched off, while regularly packed atoms are left.

5. The method of manufacturing a polycrystalline oxide thin-film transistor array substrate according to claim 1, characterized in that the selective etching in the step 2 is a dry etching process; wherein the amorphous oxide thin film layer is bombarded with a plasma of N2 or Ar gas; and wherein the dry etching process is performed under the following conditions: power of 1200-1800 W, pressure of 1500-2500 mTorr, temperature of 120-180° C., and processing time of 150-200 s.

6. The method of manufacturing a polycrystalline oxide thin-film transistor array substrate according to claim 1, characterized in that the selective etching in the step 2 is a wet etching process; wherein the etching process is performed by using an acidic etching solution capable of corroding the amorphous oxide thin film layer, such that 10-50% of the amorphous oxide thin film layer is maintained in etching region.

7. The method of manufacturing a polycrystalline oxide thin-film transistor array substrate according to claim 1, characterized in that the annealing in the step 3 is performed at a temperature of 300-450° C. for 1-2 h.

8. The method of manufacturing a polycrystalline oxide thin-film transistor array substrate according to claim 1, characterized in that the passivating in the step 3 is a process of plasma passivation.

9. The method of manufacturing a polycrystalline oxide thin-film transistor array substrate according to claim 8, characterized in that in the process of plasma passivation, the amorphous oxide thin film layer is passivated with $N_2O$ plasma; wherein the passivation process is performed under the following conditions: power of 800-1200 W, pressure of 1200-1800 mTorr, temperature of 150-250° C., and processing time of 50-100 s.

10. The method of manufacturing a polycrystalline oxide thin-film transistor array substrate according to claim 1, characterized in that in the step 4 a magnetron sputtering process is adopted to form the second oxide thin film on the oxide thin film layer after the step 3; wherein the magnetron sputtering process is performed under the following conditions: power of 3-10 Kw, pressure of 0.8-1.2 Pa, oxygen content of 5-50%, film forming rate of less than 20 Å/scan, and room temperature.

11. The method of manufacturing a polycrystalline oxide thin-film transistor array substrate according to claim 1, characterized in that the second oxide thin film formed in the step 4 has a thickness in the range of 300-1000 Å.

12. The method of manufacturing a polycrystalline oxide thin-film transistor array substrate according to claim 1, characterized in that the annealing in the step 5 is performed at a temperature of 300-450° C. for 1-2 h.

* * * * *